(12) United States Patent
Gao

(10) Patent No.: US 11,206,745 B2
(45) Date of Patent: Dec. 21, 2021

(54) HIGHLY INTEGRATED LIQUID COOLING SYSTEM DESIGN FOR DATA CENTER IT ROOM

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 15/930,172

(22) Filed: May 12, 2020

(65) Prior Publication Data

US 2021/0360821 A1   Nov. 18, 2021

(51) Int. Cl.
  *H05K 7/20* (2006.01)
  *H05K 7/14* (2006.01)

(52) U.S. Cl.
  CPC ....... *H05K 7/20254* (2013.01); *H05K 7/1497* (2013.01); *H05K 7/20381* (2013.01)

(58) Field of Classification Search
  CPC .............. H05K 7/1497; H05K 7/20254; H05K 7/20381; H05K 7/20327; H05K 7/2079
  See application file for complete search history.

(56) References Cited

U.S. PATENT DOCUMENTS

| | | | | |
|---|---|---|---|---|
| 2015/0359132 A1* | 12/2015 | Campbell | .......... | H05K 7/20236 361/700 |
| 2016/0120058 A1* | 4/2016 | Shedd | ................ | H05K 7/20327 165/244 |

\* cited by examiner

*Primary Examiner* — Mukundbhai G Patel
(74) *Attorney, Agent, or Firm* — Womble Bond Dickinson (US) LLP

(57) ABSTRACT

Disclosed are row cooling units and connecting units with a network of integrated fluid distribution piping that may be interconnected to construct a liquid cooling system to carry way heat generated by servers housed within the server racks used in data centers. The assembly of row cooling units and connecting units may be connected to the supply and return loops of the data center facility to distribute cooling liquid to the electronic components of the servers and to return heated liquid for heat removal. The network of fluid distribution piping integrated into the row cooling units and connecting units enables the configuration of the liquid cooling system to be independent of the fixed infrastructure of the facility, affording ease of scalability, serviceability, maintenance, while increasing efficiency, resiliency, availability and reliability of the liquid cooling system critical to the operation and performance of the data center.

18 Claims, 9 Drawing Sheets

HIGHLY INTEGRATED LIQUID COOLING SYSTEM DESIGN FOR DATA CENTER IT ROOM

FIELD OF THE INVENTION

Embodiments of the present invention relate generally to data center cooling. More particularly, embodiments of the invention relate to designs for liquid cooling of electronic racks in data centers.

BACKGROUND

Heat removal is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient heat removal solutions especially in the cases of cooling these high performance servers.

Thermal management of high performance servers in data centers of increasingly higher power density may use a combination of liquid and air cooling systems. To increase the efficiency of liquid cooling, liquid cooling systems may locate cooling coils closer to the heat load, necessitating the design of liquid cooling piping and fluid distribution network at the room level. In most data centers with non-raised floor, the fluid piping and distribution network may be located at the top of the server racks, increasing the installation and servicing cost for operating and maintaining the liquid cooling system, as well as increasing the design complexity due to the limited space at the top of the server racks. Reliability issue may also be a concern by having the fluid flowing over the top of the servers. In addition, the system may not be flexibly adapted and scaled to meet the ever stringent thermal management function of cloud-computing data centers requiring rapidly higher performance and power density. This is demonstrated by the need to upgrade and renew IT equipment at a much faster pace than the life cycle of the facilities housing the data centers due to the dynamic nature in IT hardware configurations and deployment scenarios. In addition, the mismatch between the shortened life cycles for system hardware due to rapidly changing business workload and the relatively long life cycles of data center requires resilient hardware solutions.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
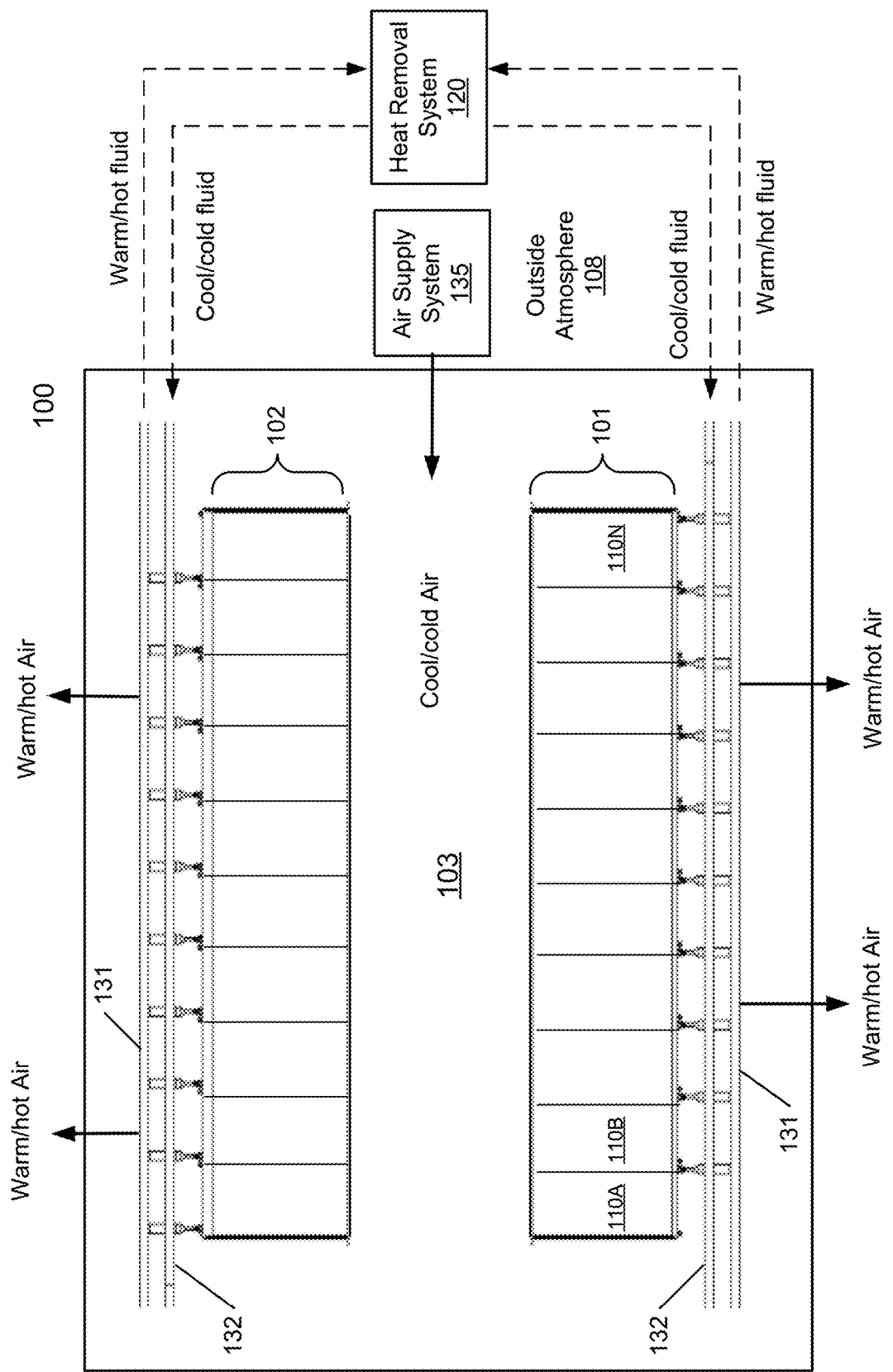
FIG. 1 is a block diagram illustrating an example of a data center facility according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Disclosed are row cooling units and connecting units with a network of integrated fluid distribution piping that may be interconnected to construct a liquid cooling system to carry away heat generated by servers housed within the server racks used in data centers. The assembly of row cooling units and connecting units may be connected to the supply and return loops of the data center facility to distribute cooling liquid to the electronic components of the servers and to return heated liquid for heat removal. The network of fluid distribution piping integrated into the cooling units and connecting units enables the configuration of the liquid cooling system to be independent of the fixed infrastructure of the facility, affording ease of scalability, serviceability, maintenance, while increasing efficiency, resiliency, availability, and reliability of the liquid cooling system critical to the operation and performance of the data center.

In one embodiment, a row cooling unit is designed with integrated fluid distribution piping to provide both cooling capacity and deliver cooling fluid housed within the row cooling unit (the cooling capacity can be understood as storing cooling liquid that is circulated within the row cooling unit's distribution piping) to servers. An upper section of the cooling unit may include a cooling coil and a bottom section may include connectors and hoses for distributing and returning the cooling fluid. Multiple row cooling units may be assembled to deliver cooling liquid to a row of server racks by interconnecting the connectors and hoses on the distributing piping of adjacent row cooling units.

In one embodiment, an end unit is designed with integrated fluid distribution piping for connecting with one or two of the row cooling units to form a fluid distribution and return loop. The end unit may include connectors positioned at the bottom for connecting with the complementary connectors at the bottom of the row cooling units. Piping may run between the bottom and top sections of the end unit for connecting with the facility infrastructure of the data center to complete the full fluid distribution system. Locating the connectors and hoses of the fluid distribution system at the bottom section of the row cooling units and end units simplifies the design, servicing and maintenance of the liquid cooling system while increasing its reliability.

In one embodiment, the connectors on one side of the row cooling unit or end unit are male connectors and the connectors on the opposite side are female connectors. The male connectors may be coupled to hard pipes and the female connectors may be coupled to flexible hoses. A row cooling unit may be connected to adjacent row cooling units or an end unit by connecting the male connectors of the row cooling unit to the female connectors of the adjacent cooling unit or the end unit on one side, and connecting the female connectors of the row cooling unit to the male connectors of the adjacent cooling unit on the opposite side. Each of the row cooling units may be individually removed, serviced, or replaced in the full system loop without causing interruptions to the operations of the other row cooling units or interrupting the fluid recirculating within the entire cooling system.

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes one or more rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N, arranged in row 101 and row 102. However, more or fewer rows of electronic racks may be implemented. Typically, rows 101-102 are aligned in parallel with frontends facing towards each other and backends facing away from each other, forming aisle 103 in between to allow an administrative person walking and performing servicing therein. However, other configurations or arrangements may also be applied.

In one embodiment, each of the electronic racks (e.g., electronic racks 110A-110N) includes a housing to house a number of electronic racks of IT components operating therein. The electronic racks can include a heat removal liquid manifold, a number of server slots, and a number of server blades capable of being inserted into and removed from the server blades or server slots. Each server blade represents a computing node having one or more processors, a memory, and/or a persistent storage device (e.g., hard disk). At least one of the processors may be attached to a liquid cold plate (also referred to as a cold plate assembly) to receive cooling liquid. In addition, one or more optional cooling fans are associated with the server blades to provide air cooling to the computing nodes contained therein. Note that a heat removal system 120 may be coupled to multiple data center systems such as data center system 100.

In one embodiment, heat removal system 120 includes an external liquid loop connected to a cooling tower or a dry cooler external to the building/housing container. The heat removal system 120 can include, but is not limited to evaporative cooling, free air, rejection to large thermal mass, waste heat recovery designs, or a chiller system with active refrigeration cycle. Heat removal system 120 may include or be coupled to a cooling liquid source that provides cooling liquid.

In one embodiment, each server blade is coupled to a heat removal liquid manifold modularly such that a server blade can be removed from the electronic rack without affecting the operations of remaining server blades on the electronic rack and the heat removal liquid manifold. In another embodiment, each server blade is coupled to the heat removal liquid manifold (also referred to as a cooling liquid manifold) through a quick-release coupling assembly having a first liquid intake connector and a first liquid outlet connector coupled to a flexible hose to distribute the heat removal liquid to the processors. The first liquid intake connector is used to receive heat removal liquid via a second liquid intake connector from the heat removal liquid manifold mounted on a backend of the electronic rack. The first liquid outlet connector is used to emit warmer or hotter liquid carrying the heat exchanged from the processors to the heat removal liquid manifold via a second liquid outlet connector and then back to a coolant distribution unit (CDU) within the electronic rack.

In one embodiment, the heat removal liquid manifold is disposed on the backend of each electronic rack and is coupled to liquid supply line 132 to receive heat removal liquid (also referred to as cooling liquid) from heat removal system 120. The heat removal liquid is distributed through a liquid distribution loop attached to a cold plate assembly on which a processor is mounted to remove heat from the processor. A cold plate is configured similar to a heat sink with a liquid distribution tube attached or embedded therein. The resulting warmer or hotter liquid carrying the heat exchanged from the processors is transmitted via liquid return line 131 back to heat removal system 120. Liquid supply/return lines 131-132 are referred to as data center or room liquid supply/return lines (e.g., global liquid supply/return lines), which supply heat removal liquid to all of the electronic racks of rows 101-102. In one embodiment, liquid supply/return lines 131-132 may be integrated within the electronic racks 110A-110N. Electronic racks 110A-110N may be assembled to form rows 101 or 102 by interconnecting the liquid supply/return lines 131-132 of adjacent electronic racks 110A-110N and the liquid supply/return lines 131-132 of an end unit with supply/return lines of the data center facility to complete the cooling liquid supply and return loop. The liquid supply line 132 and liquid return line 131 are coupled to a heat exchanger of a CDU located within each of the electronic racks, forming a primary loop. The secondary loop of the heat exchanger is coupled to each of the server blades in the electronic rack to deliver the cooling liquid to the cold plates of the processors.

In one embodiment, data center system 100 further includes an optional airflow delivery system 135 to generate an airflow to cause the airflow to travel through the air space of the server blades of the electronic racks to exchange heat generated by the computing nodes due to operations of the computing nodes (e.g., servers) and to exhaust the airflow exchanged heat to an external environment 108 outside of housing/room/building. For example, air supply system 135 generates an airflow of cool/cold air to circulate from aisle 103 through electronic racks 110A-110N to carry away exchanged heat. The cool airflows enter the electronic racks through their frontends and the warm/hot airflows exit the electronic racks from their backends. The warm/hot air with exchanged heat is exhausted from room/building. Thus, the cooling system is a hybrid liquid-air cooling system, where a portion of the heat generated by a processor is removed by cooling liquid via the corresponding cold plate, while the remaining portion of the heat generated by the other electronics or processing devices is removed by airflow cooling.

Figure 2:
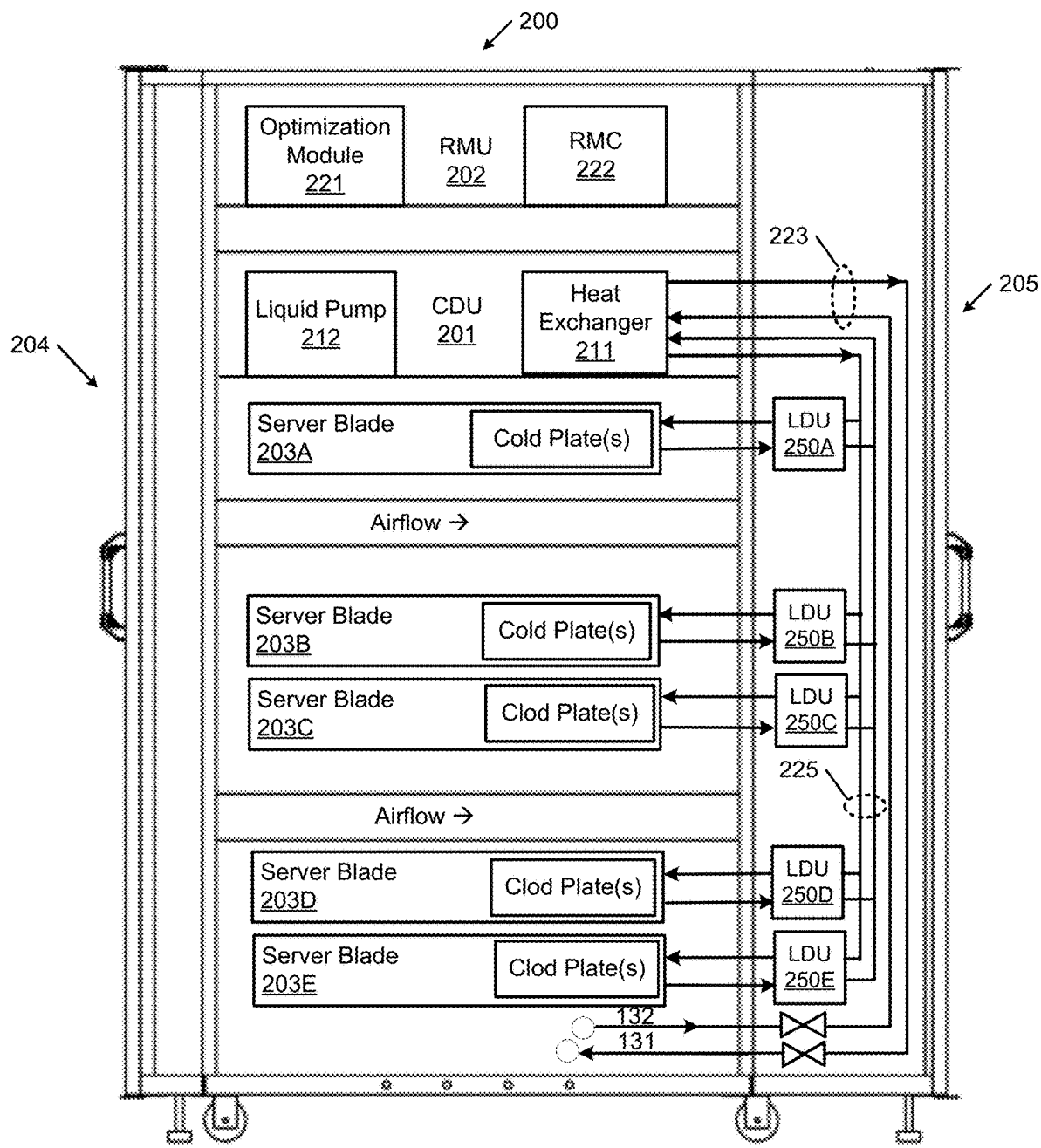
FIG. 2 is a block diagram illustrating an example of an electronic rack according to one embodiment.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, CDU 201, optional rack management unit (RMU) 202, and one or more server blades 203A-203E (collectively referred to as server blades 203). Server blades 203 can be inserted into an array of server slots respectively from frontend 204 or backend 205 of electronic rack 200. Note that although there are five server blades 203A-203E shown here, more or fewer server blades may be maintained within electronic rack 200. Also note that the particular positions of CDU 201, RMU 702, and server blades 203 are shown for the purpose of illustration only; other arrangements or configurations of CDU 201, RMU 202, and server blades 203 may also be implemented. In one embodiment, electronic rack 200 can be either open to the environment or partially contained by a rack container, as long as the cooling fans can generate airflows from the frontend to the backend.

In addition, for at least some of the server blades 203, an optional fan module (not shown) is associated with the server blade. Each of the fan modules includes one or more cooling fans. The fan modules may be mounted on the backends of server blades 203 or on the electronic rack to generate airflows flowing from frontend 204, traveling through the air space of the sever blades 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid heat exchanger or cooling coil. Heat exchanger 211 includes a first loop 223 with inlet and outlet ports having a first pair of liquid connectors coupled to liquid supply/return lines 131-132 that are integrated to the electronic rack 200 to form a primary loop. The integrated liquid supply/return lines 131-132 may be disposed on the bottom of backend 205 of electronic rack 200. The liquid supply/return lines 131-132, also referred to as room liquid supply/return lines, are coupled to heat removal system 120 through supply/return lines 131-132 of one or more adjacent electronic racks 200 and/or an end unit as will be explained. In addition, heat exchanger 211 further includes a second loop with two ports having a second pair of liquid connectors coupled to liquid manifold 225 to form a secondary loop, which may include a supply manifold (also referred to as a rack liquid supply line) to supply cooling liquid to server blades 203 and a return manifold (also referred to as a rack liquid return line) to return warmer liquid back to CDU 201. Note that CDUs 201 can be any kind of CDUs that are commercially available or may be customized. In one embodiment, heat exchanger 211 of CDU 201 may be an air-to-liquid heat exchanger or cooling coil. The details of CDUs 201 will not be described herein.

Each of server blades 203 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as computing nodes, such as CPU server and GPU server, and servers with ASIC and FPGA units). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, video streaming, deep learning algorithms or modeling, etc., as a part of a software-as-a-service or SaaS platform). In response to the request, the host server distributes the tasks to one or more of the computing nodes or compute servers (e.g., having one or more GPUs or ASICs) managed by the host server. The compute servers perform the actual tasks, which may generate heat during the operations.

Electronic rack 200 further includes optional RMU 202 and power supply unit (PSU) (not shown in the figure) configured to provide and manage power supplied to servers 203, and CDU 201. RMU 202 may be coupled to a battery backup unit (also not shown) to provide backup energy to the electronic rack 200 and servers 203. The PSU may include the necessary circuitry (e.g., an alternating current (AC) to direct current (DC) or DC to DC power converter, battery, transformer, or regulator, etc.,) to regulate power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, server blades 203, CDU 201, and fan modules. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by the fan modules and liquid pump 212, which may be proportional to their respective speeds. These operating data are referred to as real-time operating data. Note that the monitor may be implemented as a separate module within RMU 202. Based on the operating data, optimization module 221 performs an optimization using a predetermined optimization function or optimization model to derive a set of optimal fan speeds for fan modules and an optimal pump speed for liquid pump 212.

Figure 3:
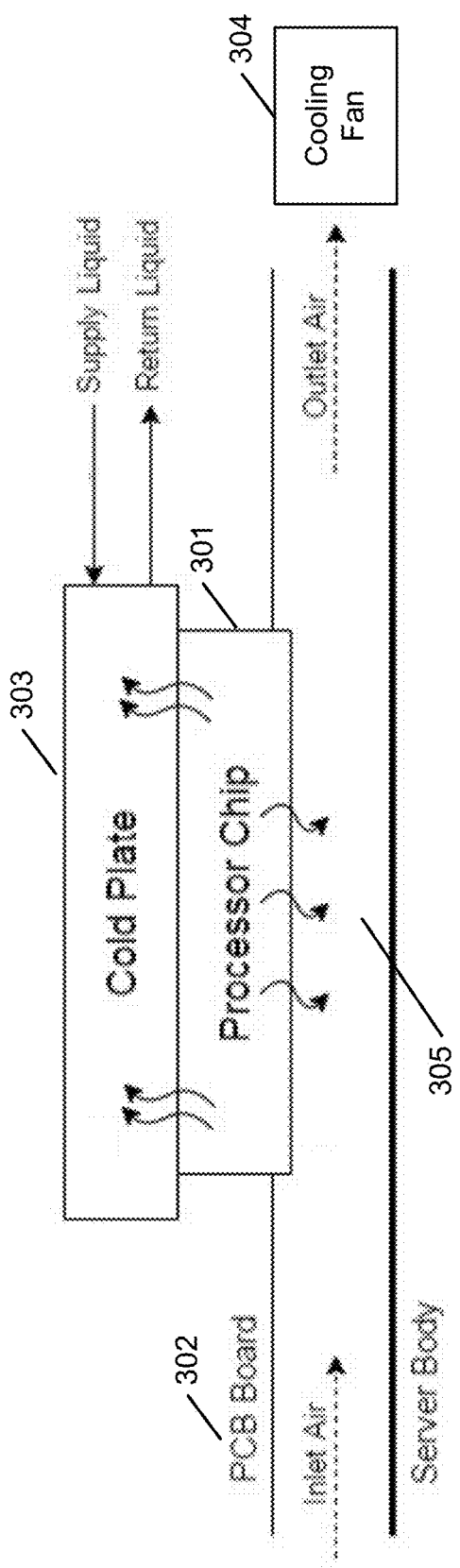
FIG. 3 is a block diagram illustrating an example of a cold plate configuration according to one embodiment.

FIG. 3 is a block diagram illustrating a processor cold plate configuration according to one embodiment. The processor/cold plate structure 400 can represent any of the processors/cold plate structures of server blades 203 as shown in FIG. 2. Referring to FIG. 3, processor 301 is plugged onto a processor socket mounted on printed circuit board (PCB) or motherboard 302 coupled to other electrical components or circuits of a data processing system or server. Processor 301 also includes a cold plate 303 attached to it, which is coupled to liquid supply line and liquid return line. A portion of the heat generated by processor 301 is removed by the cooling liquid via cold plate 303. The remaining portion of the heat enters into open air space 305, which may be removed by an airflow generated by cooling fan 304.

Referring back to FIG. 2, according to one embodiment, electronic rack 200 further optionally includes one or more liquid distribution units (LDUs), such as LDUs 250A-250E (collectively referred to as LDUs 250), positioned between server blades 203 and rack manifolds 225. Each LDU operates as a local liquid distribution manifold and also a cooling device to a server blade 203. In FIG. 2, LDUs 250 are shown outside of the server blades 203, but they can be designed in the server blades 203. In this example, there is an LDU corresponding to one of the server blades 203. However, in other embodiments, although not shown, an LDU can be associated with multiple server blades 203.

Similar to a CDU, a primary loop is formed between an LDU and rack manifold 225, while a secondary loop is formed between the LDU and a server blade. As a result, the liquid distribution loop is significantly shortened compared to a conventional system. In a conventional system, the cooling liquid received either from supply line 132 or from CDU 201 has to travel through each of the cold plates in server blades 203. As a result, the liquid distribution loop is much longer and the power to pump the liquid requires much higher. With LDUs 250, each secondary loop coupled to the cold plates of a server blade is a local individual loop. In one embodiment, the cooling liquid distributed to the server blade is a two-phase cooling liquid that transitions between a liquid form and a vapor form based on the temperature. In such a configuration, a liquid pump for the secondary loop may not be needed.

Figure 4:
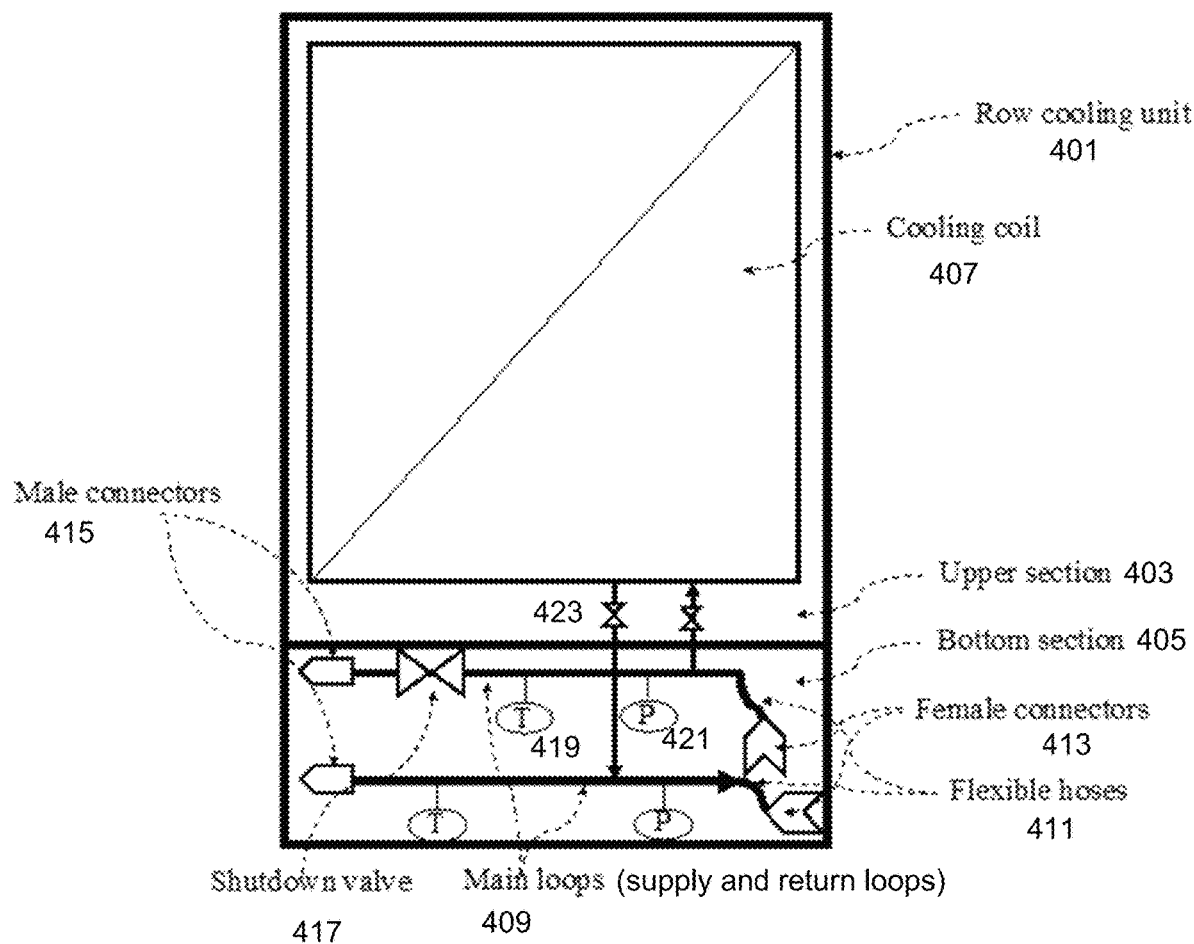
FIG. 4 is a side view of a row cooling unit with an integrated liquid cooling system according to one embodiment.

FIG. 4 is a side view of a row cooling unit 401 with an integrated liquid cooling system according to one embodiment. Row cooling unit 401 may be integrated into any of the electronic racks as shown in FIG. 1, such as, for example, electronic racks 110A-110N, or electronic rack 200 of FIG. 2. Row cooling unit 401 may have two main sections, upper section 403 and bottom section 405.

Upper section 403 may contain cooling coil 407. In one embodiment, cooling coil 407 may include CDU 201 or some of the main functions of a CDU. In one embodiment, cooling unit may be a liquid-to-air cooling coil or a liquid-to-liquid cooling coil. Bottom section 405 may contain connectors, pipes, and hoses for the main fluid loops 409 comprising the supply loop and the return loop. The supply loop functions as the liquid supply line 132 in FIG. 1 and delivers fluid to server blades 203. Cooling coil 407 may be connected to main fluid loops 409 through one or more two-way valves 423, which may be used to shut down the cooling liquid to, or the warm liquid returning from, cooling coil 407. Thus, the two way valves can be used to shut down the fluid recirculation within the row cooling unit 401.

In one embodiment, one end of the supply loop or the return loop of main fluid loops 409 is connected with a flexible hose 411. The end of flexible hose 411 is coupled with a female connector 413. The opposite end of the supply loop or the return loop of main fluid loops 409 is connected with a male connector 415 via a rigid tube. The female and male connectors are complementary so that a female connector 413 of row cooling unit 401 may connect to a corresponding male connector 415 of an adjacent row cooling unit 401 for the supply loop or the return loop of main fluid loops 409. The supply loop of row cooling unit 401 may thus receive cooling liquid from an adjacent row cooling unit 401 of a row of server racks via female connector 413, flexible hose 411 of supply line of main loops 409 located at bottom section 405 to supply the cooling liquid to cooling coil 407. The return loop of row cooling unit 401 may return the warm liquid carrying heat exchanged from server blades 203 back to the adjacent row cooling unit 401 via piping, flexible hose 411, and female connector 413 of liquid return line of main loops 409. In one embodiment, the cooling liquid received from, or the warm liquid returned to, the adjacent row cooling unit 401 may be transported via male connectors 415 of the supply loop or the return loop, respectively. In one embodiment, flexible hoses 411 and the coupled female connectors 413 are stowed at bottom section 402 when they are not connected to an adjacent row cooling unit 401.

A shutdown valve 417 of the supply loop may be used to shut off the flow of the cooling liquid to a downstream row cooling unit 401. In one embodiment, a shutdown valve 417 of the return loop may be used to shut off the flow of the warm liquid from an upstream row cooling unit 401. Sensors such as temperature sensors 419 and pressure sensors 421 may be connected to the supply loop or the return loop to monitor the temperature and pressure of the cooling liquid or warm liquid. Upper section 403 and bottom section 405 are modular and may be removed, replaced, or otherwise serviced individually. The piping or fluid connection between upper section 403 and bottom section 405 may be disconnected using quick disconnects or flanges.

Figure 5:
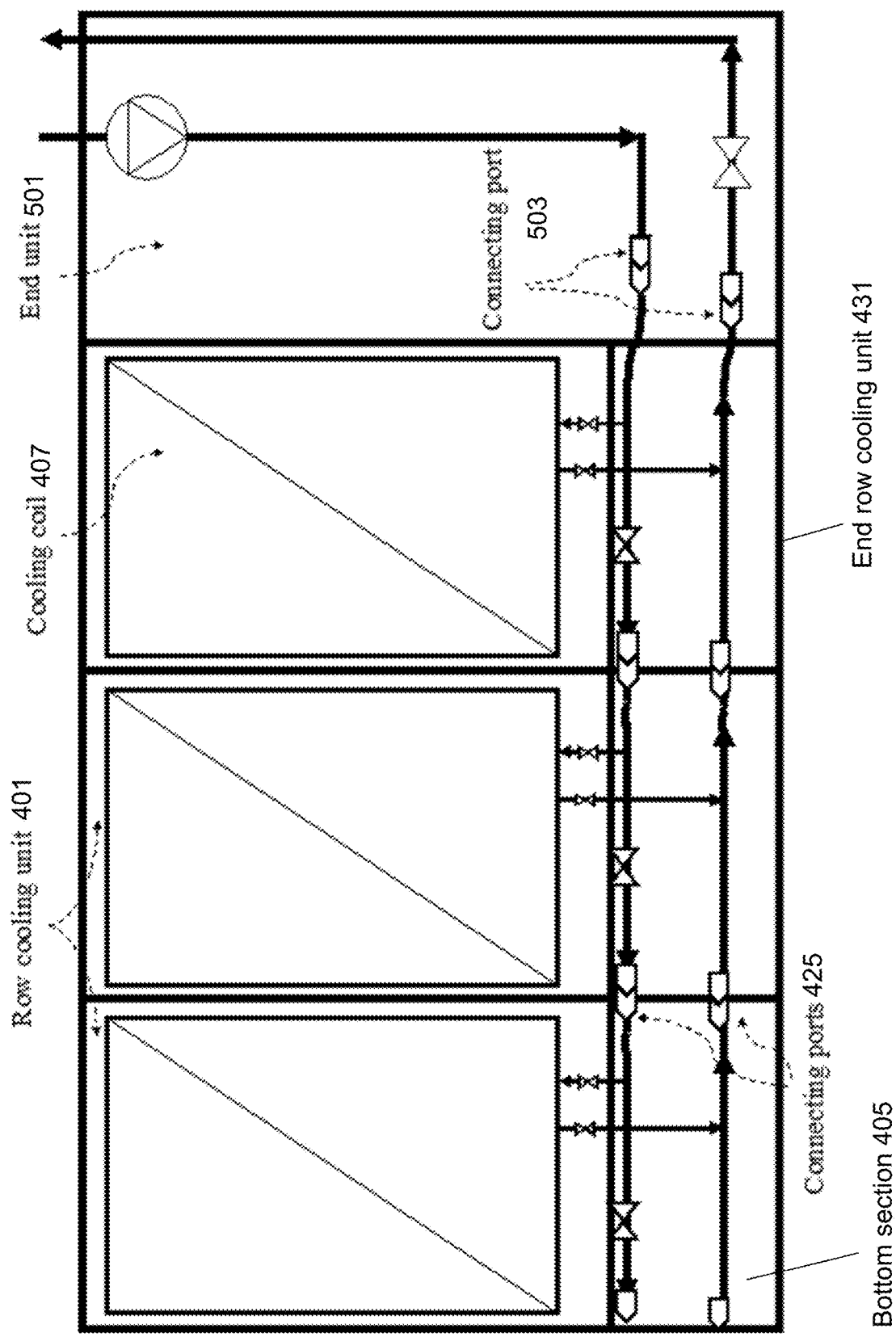
FIG. 5 is a side view of an assembly of several row cooling units with an end unit to form a cooling liquid supply loop and a return loop according to one embodiment.

FIG. 5 is a side view of an assembly of several row cooling units 401 with an end unit 501 to form a cooling liquid supply loop and a warm liquid return loop according to one embodiment. The row cooling units 401 are assembled adjacent to one another so that their bottom sections 405 abut for forming the connection ports 425 between adjacent pairs of row cooling units 401 for the supply loop and return loop. For example, the connection port 425 for the supply loop may be formed by connecting a female connector 413 of the supply loop of a row cooling unit 401 with the male connector 415 of the supply loop of an adjacent upstream row cooling unit 401 that supplies the cooling liquid. Similarly, the connection port 425 for the return loop may be formed by connecting a female connector 413 of the return loop of the row cooling unit 401 with the male connector of the return loop of the adjacent downstream row cooling unit 401 that carries away the warm liquid.

End unit 501 connects the assembly of row cooling units 401 with the supply and return lines of the data center facility to complete the cooling liquid supply and warm liquid return loop. End unit 501 may include connectors positioned at the bottom for connecting with complementary connectors at the bottom of an end row cooling unit 431 of the assembly. Note that any cooling unit 401 can be used as an end row cooling unit 431, since the bottom section design and connectors follow an identical design specification. Piping may run between the bottom and top sections of the end unit 501 to connect with the supply and return lines of the facility from above. End unit 501 may be placed adjacent to end row cooling unit 431 of the assembly so their bottom sections abut for forming the connecting port 503 for the supply loop and return loop. For example, the connecting port 503 for the supply loop may be formed by connecting a female connector 413 of the supply loop of end row cooling unit 431 with the male connector of the supply loop of end unit 501 supplying the cooling liquid. Similarly, the connecting port 503 for the return loop may be formed by connecting a female connector 413 of the return loop of end row cooling unit 431 with the male connector of the return loop of end unit 501 that carries away the warm liquid.

In one embodiment, end unit 501 may include valve and fluid pumps to shut off or control the flow of the cooling or warm fluids. Advantageously, the network of fluid distribution piping, hoses, and connectors integrated into row cooling units 401 and end unit 501 enables the configuration of the liquid cooling system to be independent of the fixed infrastructure of the facility, affording ease of scalability, serviceability, maintenance, while increasing efficiency and reliability of the liquid cooling system.

Figure 6:
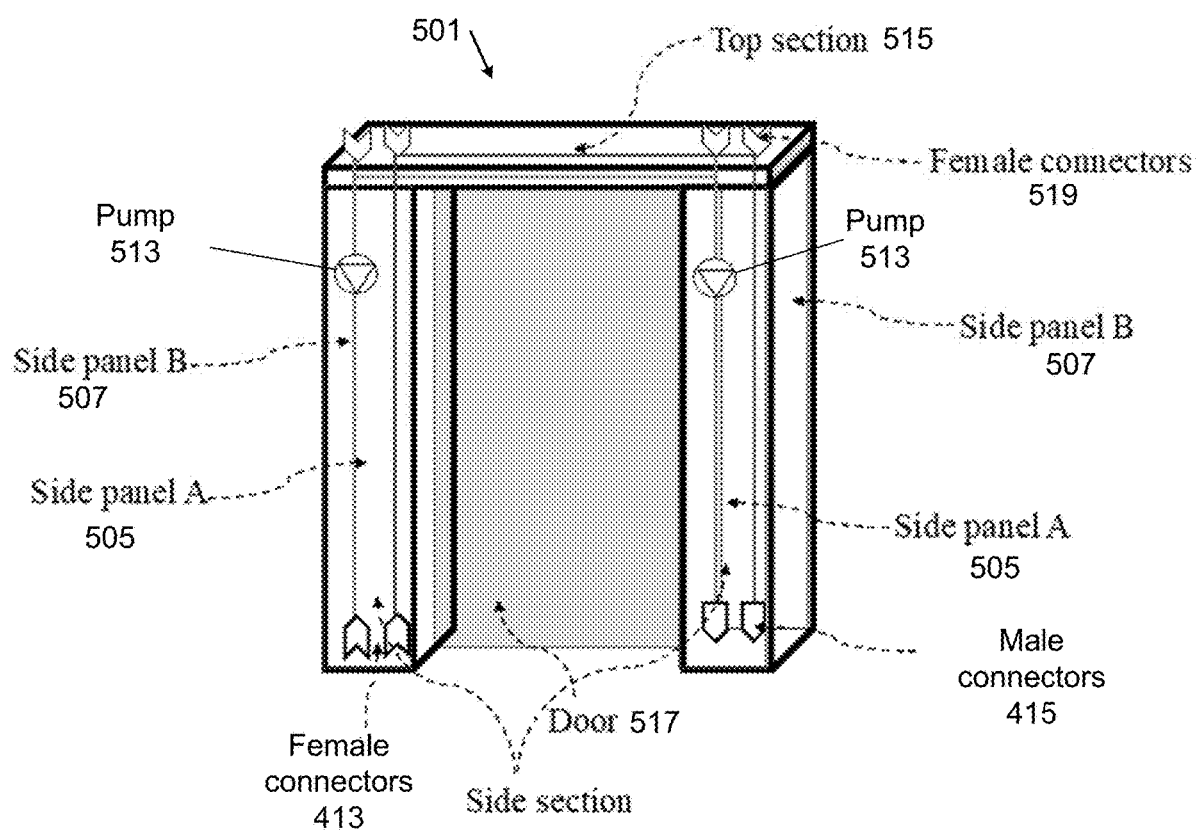
FIG. 6 is a side view of an end unit of the liquid cooling system according to one embodiment.

FIG. 6 is a side view of an end unit 501 of the liquid cooling system according to one embodiment. End unit 501 may include integrated fluid distribution piping for connecting to the end of one or two rows of row cooling units 401, such as the end row cooling unit 431 shown in FIG. 5, to form cooling fluid supply loop and warm liquid return loop. End unit 501 may be symmetrical so that it may be connected to row cooling unit 401 from either side. For example, FIG. 6 shows a front side (out of the page) of end unit 501 covered by side panel A 505 and a back side (into the page) covered by side panel B 507. End unit 501 is symmetrical in the sense that end unit 501 may connect to end row cooling unit 431 from the front side when side panelA 505 is removed, or alternatively, end unit 501 may connect to end row cooling unit 431 from the back side when side panel B 507 is removed.

In one embodiment, a female side of end unit 501 has a first set of branches of the supply loop and return loop whose ends are coupled with female connectors 413. The female connectors 413 may be connected to flexible hoses as in row cooling unit 401. An opposite male side of end unit 501 has a second set of branches of the supply loop and return loop whose ends are coupled with male connectors 415. The male connectors 415 may be connected to rigid tubes as in row cooling unit 401. The female connectors 413 and the male connectors 415 of end unit 501 may be the same as those of row cooling unit 401. This means that female connectors 413 and male connectors 415 of end unit 501 can mate with the corresponding male connectors 415 and female connectors 413 of row cooling units 401 to achieve full functioning of the liquid cooling system. For example, the female connectors 413 or male connectors 415 of end unit 501 may connect to corresponding male connectors 415 or female connectors 413, respectively, of an end row cooling unit 431 to supply the cooling fluid through the supply loop and to receive the warm fluid through the return loop. The first and second set of branches of the supply loop and return loop may be connected respectively to each of two end row cooling units 431 that are at the end of two rows of server racks. In one embodiment, only one set of the branches may be connected to one end row cooling unit 431 at the end of one row of server racks while the other set of branches may be shut off using valves. End unit 501 may have pumps 513 for pumping the cooling fluid. Pumps 513 can operate in parallel or as redundant unit for each other.

The top section 515 of end unit 501 may include female connectors 519 on both branches of the supply loop and return loop for connecting to the supply and return lines of the facility from above. The female connectors 519 may be connected to flexible hoses to allow the piping of end unit 501 to flexibly extend to connect to the male connectors of the facility. The female connectors 519 for connecting to the facility may have a larger diameter than the female connectors 413 on the bottom section for larger flow rate. The two sets of branches of the supply loop and return loop are connected by piping that traverse the top section 515. A removable door may be installed between the female side and male side below the top section 515 to allow access between the two rows of connected cooling units 401. In one embodiment, female connectors 519 on the top section 515 of end unit 501 may be male connectors that connect to female connectors of the facility. The choice of a female or male type of connectors may depend on the full system design.

Figure 7:
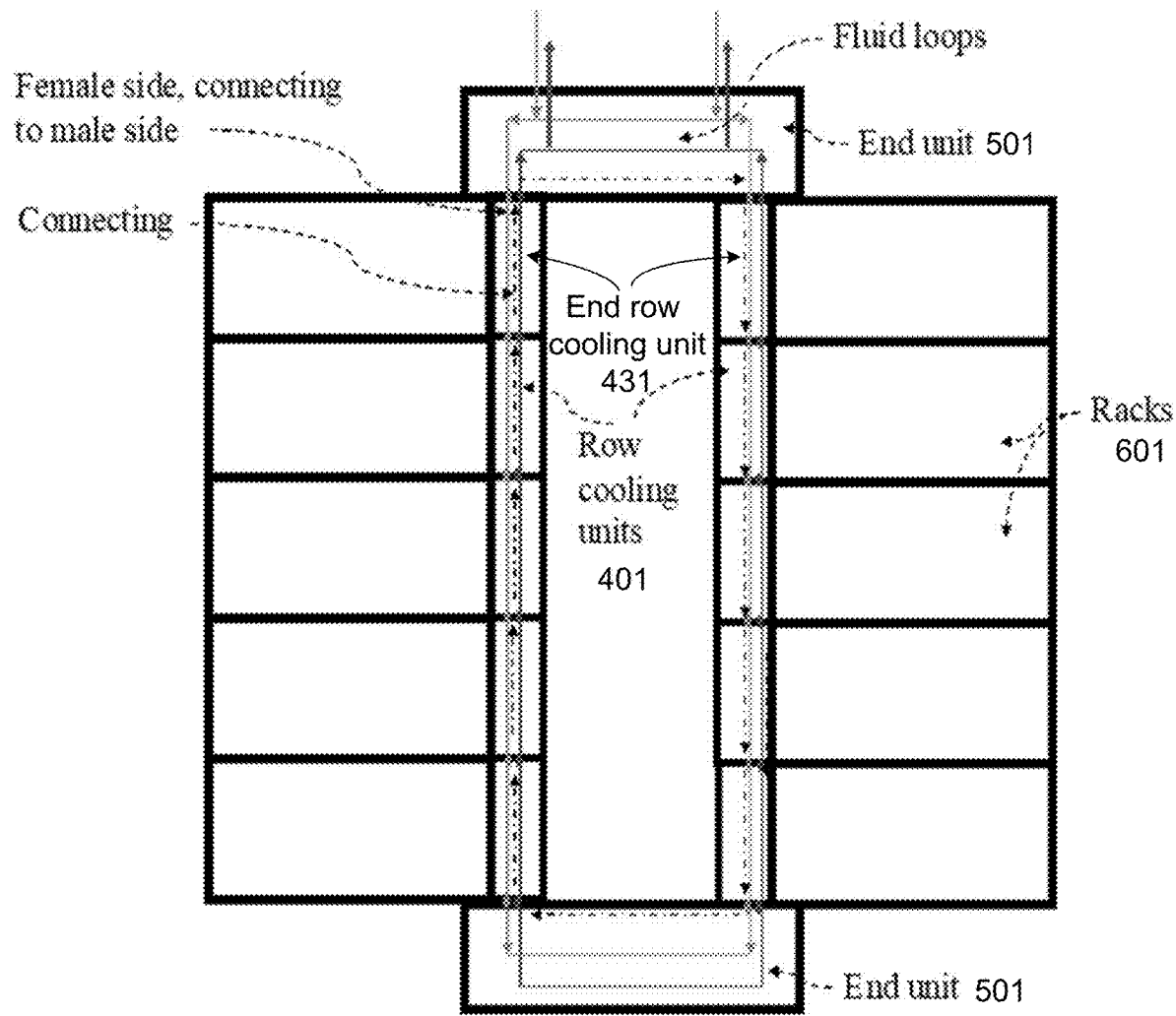
FIG. 7 is a top level view of an assembly of two rows of row cooling units with end units and connected to the facility of an IT room to form a cooling liquid supply loop and a warm liquid return loop of a liquid cooling system according to one embodiment.

FIG. 7 is a top level view of an assembly of two rows of row cooling units 401 with end units 501 and connected to the facility of an IT room to form a cooling liquid supply loop and a warm liquid return loop of a liquid cooling system according to one embodiment. The two rows of row cooling units 401 distribute and return cooling liquid to two rows of server racks 601. On one side of a row cooling unit 401, the female connectors of the supply and return loops are connected to the corresponding male connectors of an adjacent row cooling unit 401 or of an end unit 501. On the opposite side of the row cooling unit 401, the male connectors of the supply and return loops are connected to the corresponding female connectors of the other adjacent row cooling unit 401 or of the end unit 501. The dashed line indicates the direction of the connection of the female-male connectors. While FIG. 7 shows only one end unit 501 connecting to the facility loops, in one embodiment, facility loops can be connected to both end units 501.

Each row of row cooling units 401 and server racks 601 is bookended by two end units 501, one on each end. Because the end units 501 are symmetrical, the end units 501 may be connected to the row cooling units 401 from the front side or the back side. One end unit 501 may connect to the supply and return lines of the facility to complete the distribution loops. In one embodiment, both end units 501 may be connected to the supply and return lines of the facility. The liquid or warm liquid may flow in any direction. That is, the fluid may flow in a clockwise or counter-clockwise direction. The capability to pump the fluid in either direction provides redundancy so that row cooling units 401 may be individually removed, serviced, or replaced without causing interruptions to the operation of the liquid cooling system. For example, to service a row cooling unit 401, the supply loop and the return loop of the two adjacent row cooling units 401 may be shut off through their respective shutdown valves 417 to stop the flow of cooling liquid into, and the return of warm liquid from, the row cooling unit 401 being serviced. As mentioned, both end units may be designed to connect to the facility. This enables a full system operation even when the top two end row cooling units 431 on the top shown in FIG. 7 shut down at the same time. In one embodiment, only a subset of the row cooling units 401 have an upper section 403 that includes cooling coil 407 to distribute and return cooling liquid to a subset of the server racks 601.

Figure 8:
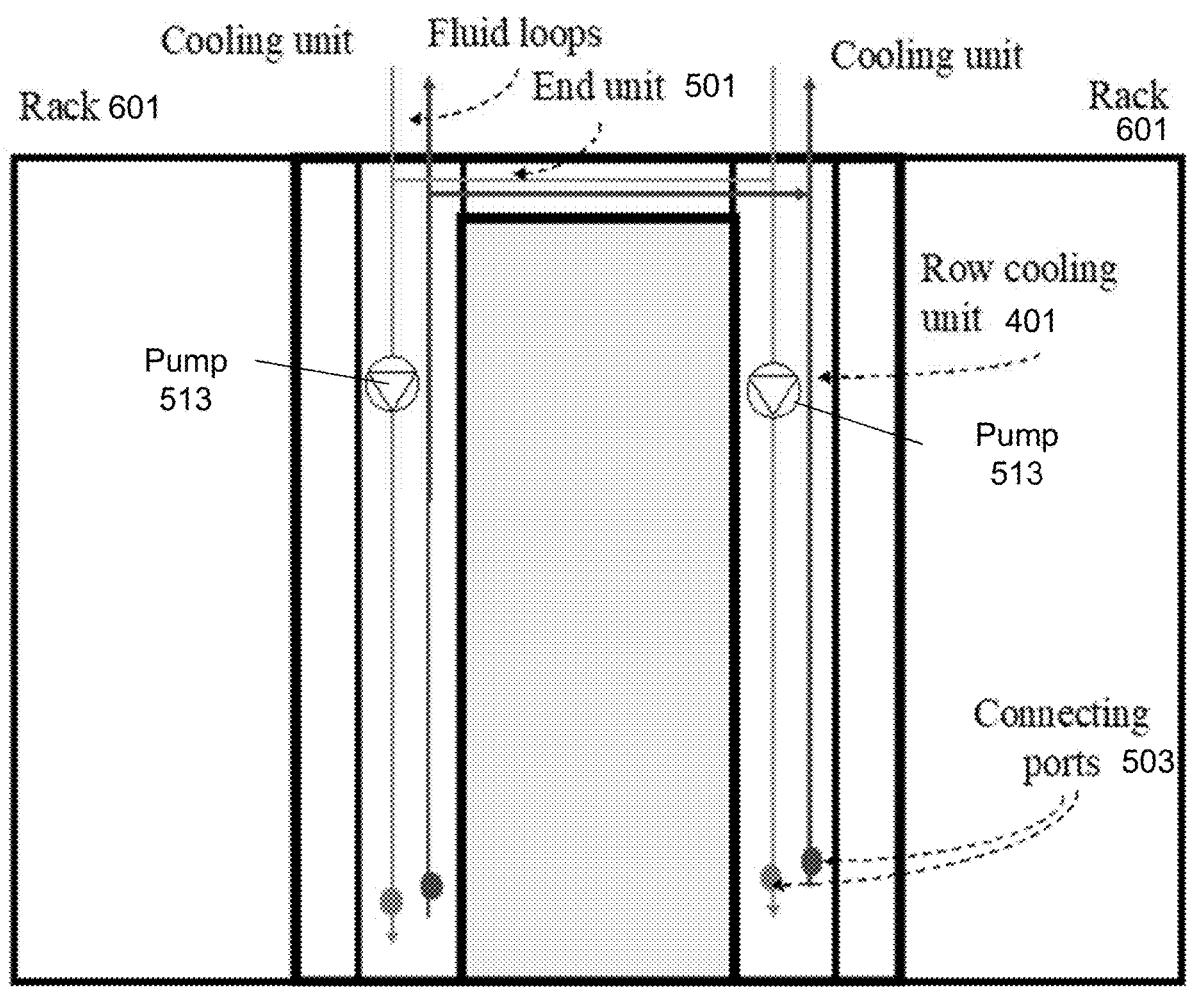
FIG. 8 is a side view of an assembly of two rows of row cooling units with an end unit and connected to the facility to construct a liquid cooling system according to one embodiment.

FIG. 8 is a side view of an assembly of two rows of row cooling units 401 with an end unit 501 and connected to the facility to construct a liquid cooling system according to one embodiment. End unit 501 may connect to the supply and return lines of the facility from the top to complete the distribution loop of the liquid cooling system. The bottom sections of end unit 501 abut row cooling units 401 to form the connecting port 503 for connecting the supply loop and return loop to row cooling units 401 on either side of end unit 501. Valves (not shown) and pumps 513 of end unit 501 may be used to control the flow of the fluid. As shown, the network of fluid distribution piping integrated into the row cooling units 401 and the end units 501 enables the liquid cooling system to the server racks 601 to be configured independently of the fixed infrastructure of the facility, affording ease of scalability, serviceability, maintenance, while increasing efficiency and reliability of the liquid cooling system critical to the operation and performance of the data center.

Figure 9:
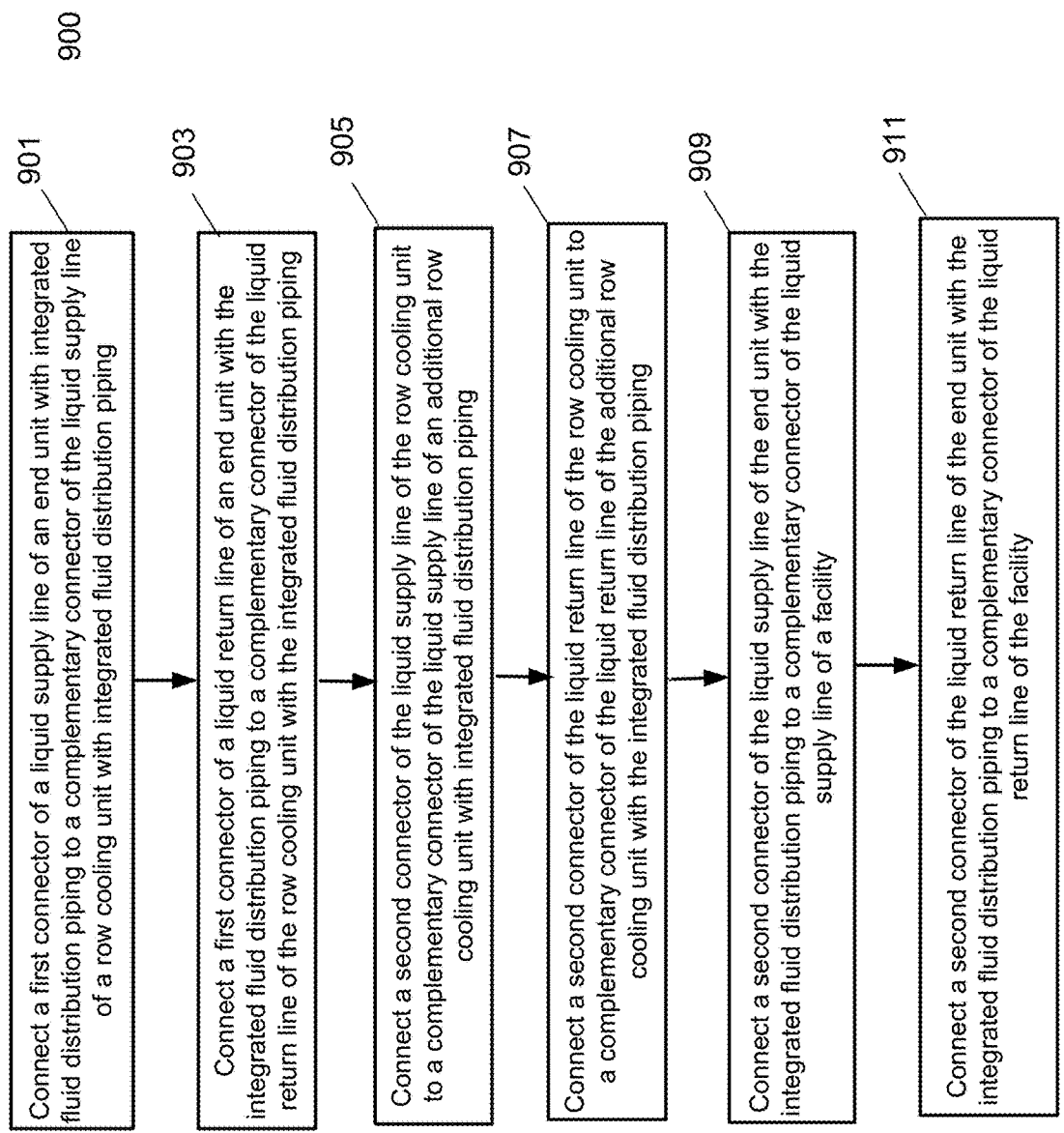
FIG. 9 is a flow diagram illustrating an example of a method for assembling the row cooling unit and the end unit to construct a liquid cooling system according to one embodiment.

FIG. 9 is a flow diagram illustrating an example of a method 900 for assembling the row cooling unit 401 and the end unit 501 to construct a liquid cooling system according to one embodiment. Method 900 may be performed by processing logic which may include software, hardware, or a combination thereof.

At operation 901, the method 900 connects a first connector of a liquid supply line of the end unit 501 with integrated fluid distribution piping to a complementary connector of the liquid supply line of the row cooling unit 401 with integrated fluid distribution piping. The first connector may be a male or female connector whose complementary connector is a female or male connector, respectively.

At operation 903, the method 900 connects a first connector of a liquid return line of the end unit 501 with the integrated fluid distribution piping to a complementary connector of the liquid return line of the row cooling unit 401 with the integrated fluid distribution piping. The first connector may be a male or female connector whose complementary connector is a female or male connector, respectively.

At operation 905, the method 900 connects a second connector of the liquid supply line of the row cooling unit with the integrated fluid distribution piping to a complementary connector of the liquid supply line of an additional row cooling unit with integrated fluid distribution piping. The second connector may be a male or female connector whose complementary connector is a female or male connector, respectively. In one embodiment, female connectors are coupled with flexibles hoses and male connectors are coupled with rigid tubes. The second connector may preferably be a female connector to make it more feasible for an operator to manually align the female connector to the male connector when making the connection between the two row cooling units.

At operation 907, the method 900 connect a second connector of the liquid return line of the row cooling unit with the integrated fluid distribution piping to a complementary connector of the liquid return line of the additional row cooling unit with the integrated fluid distribution piping. The second connector may be a male or female connector whose complementary connector is a female or male connector, respectively.

At operation 909, the method 900 connects a second connector of the liquid supply line of the end unit 501 with the integrated fluid distribution piping to a complementary connector of the liquid supply line of a facility supplying the cooling liquid. The second connector may be a male or female connector whose complementary connector is a female or male connector, respectively.

At operation 911, the method 900 connects a second connector of the liquid return line of the end unit 501 with the integrated fluid distribution piping to a complementary connector of the liquid return line of the facility. The second connector may be a male or female connector whose complementary connector is a female or male connector, respectively.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A liquid cooling apparatus of a data center, comprising: one or more row cooling units, each of the row cooling units having a first fluid distribution piping to distribute supply liquid received from a cooling liquid source to a thermal load and to distribute return liquid received from the thermal load back to the cooling liquid source, the first fluid distribution piping including:
  a first connector configured to receive the supply liquid from the cooling source for distribution to the thermal bad;
  a second connector configured to return the return liquid received from the thermal load back to the liquid source;
  a third connector configured to supply the supply liquid to a first adjacent one of the row cooling units; and
  a fourth connector configured to receive the return liquid returned from the first adjacent one or a second adjacent one of the row cooling units; and
an end unit having a second fluid distribution piping to distribute the supply liquid received from a supply line of the data center to the one or more row cooling units and to distribute the return liquid received from the one or more row cooling units to a return line of the data center, the row cooling units and the end unit being configured to connect the first distribution piping and the second fluid distribution piping to recirculate the supply liquid and to remove heat from a changing combined thermal load of the data center without changes to the supply line of the data center.

2. The liquid cooling apparatus of claim 1, wherein the first connector, the second connector, the third connector, and the fourth connector are disposed in a lower section of each one of the row cooling units.

3. The liquid cooling apparatus of claim 1, wherein the first connector comprises one of a male connector or a female connector, wherein the third connector comprises a connector that is complementary to the male connector or the female connector of the first connector, wherein the second connector comprises one of a male connector or a female connector, and wherein the fourth connector comprises a connector that is complementary to the male connector or the female connector of the second connector.

4. The liquid cooling apparatus of claim 3, wherein the male connector is coupled to a rigid piping of the first fluid distribution piping, and wherein the female connector is coupled to a flexible hose of the first fluid distribution piping.

5. The liquid cooling apparatus of claim 1, wherein the first fluid distribution piping further comprises a shutdown valve configured to shut off the supply liquid to the first adjacent one of the row cooling units.

6. The liquid cooling apparatus of claim 1, wherein an upper section of the row cooling unit comprises a cooling coil configured to receive the return liquid from the thermal load and to return the return liquid back to the first fluid distribution piping.

7. The liquid cooling apparatus of claim 1, wherein the second fluid distribution piping comprises:
  a first connector configured to receive the supply liquid from the supply line of the data center;
  a second connector configured to return the return liquid to the return line of the data center;

a third connector configured to supply the supply liquid to a first end row cooling unit of the one or more row cooling units;

a fourth connector configured to receive the return liquid from the first end row cooling unit of the one or more row cooling units;

a fifth connector configured to supply the supply liquid to a second end row cooling unit of the one or more row cooling units; and a sixth connector configured to receive the return liquid from the second end row cooling unit of the one or more row cooling units.

8. The liquid cooling apparatus of claim 7, wherein the first connector and the second connector are disposed in an upper section of the end unit, and wherein the third connector, the fourth connector, the fifth connector, and the sixth connector are disposed in a lower section of the end unit.

9. The liquid cooling apparatus of claim 7, wherein the end unit comprises a front side and a back side that are symmetrical to allow the second fluid distribution piping of the end unit to supply the supply liquid to the first end row cooling unit or the second end row cooling unit and to receive the return liquid from the first end row cooling unit or the second end row cooling unit from either the front side or the back side.

10. A data center system, comprising:
a plurality of electronic racks, each of the electronic racks containing a plurality of server blades and each of the server blades corresponding to one or more servers, wherein each of the electronic racks includes a rack manifold having a rack liquid supply line to receive supply cooling liquid from a cooling liquid source and a rack liquid return line to return warm liquid containing heat exchanged from the server blades back to the cooling liquid source;

a plurality of row cooling units, each of the row cooling units having a first fluid distribution piping to distribute supply liquid received from the cooling liquid source to the rack liquid supply line of a corresponding one of the electronic racks and to distribute return liquid received from the rack liquid return line of the corresponding one of the electronic racks back to the cooling liquid source, the first fluid distribution piping including:
a first connector configured to receive the supply liquid from the cooling source for distribution to the corresponding one of the electronic racks;
a second connector configured to return the return liquid received from the corresponding one of the electronic racks back to the liquid source;
a third connector configured to supply the supply liquid to a first adjacent one of the row cooling units; and
a fourth connector configured to receive the return liquid returned from the first adjacent one or a second adjacent one of the row cooling units; and an end unit having a second fluid distribution piping to distribute the supply liquid received from a supply line of the data center system to the plurality of row cooling units and to distribute the return liquid received from the plurality of row cooling units to a return line of the data center system, the row cooling units and the end unit being configured to connect the first distribution piping and the second fluid distribution piping to recirculate the supply liquid and to remove heat from a changing combined thermal load of the plurality of electronic racks without changes to the supply line of the data center system.

11. The data center system of claim 10, wherein the first connector, the second connector, the third connector, and the fourth connector are disposed in a lower section of each one of the row cooling units.

12. The data center system of claim 10, wherein the first connector comprises one of a male connector or a female connector, wherein the third connector comprises a connector that is complementary to the male connector or the female connector of the first connector, wherein the second connector comprises one of a male connector or a female connector, and wherein the fourth connector comprises a connector that is complementary to the male connector or the female connector of the second connector.

13. The data center system of claim 12, wherein the male connector is coupled to a rigid piping of the first fluid distribution piping, and wherein the female connector is coupled to a flexible hose of the first fluid distribution piping.

14. The data center system of claim 10, wherein the first fluid distribution piping further comprises a shutdown valve configured to shut off the supply liquid to the first adjacent one of the row cooling units.

15. The data center system of claim 10, wherein an upper section of the row cooling unit comprises a cooling coil configured to receive the return liquid from the corresponding one of the electronic racks and to return the return liquid back to the first fluid distribution piping.

16. The data center system of claim 10, wherein the second fluid distribution piping comprises:
a first connector configured to receive the supply liquid from the supply line of the data center;
a second connector configured to return the return liquid to the return line of the data center;
a third connector configured to supply the supply liquid to a first end row cooling unit of the plurality of row cooling units;
a fourth connector configured to receive the return liquid from the first end row cooling unit of the plurality of row cooling units;
a fifth connector configured to supply the supply liquid to a second end row cooling unit of the plurality of row cooling units; and
a sixth connector configured to receive the return liquid from the second end row cooling unit of the plurality of row cooling units.

17. The data center system of claim 16, wherein the first connector and the second connector are disposed in an upper section of the end unit, and wherein the third connector, the fourth connector, the fifth connector, and the sixth connector are disposed in a lower section of the end unit.

18. The data center system of claim 10, wherein the data center system further comprises two of the end units to distribute the supply liquid to the plurality of row cooling units, wherein the first fluid distribution piping is located in a lower section of the plurality of the row cooling units, wherein only a subset of the plurality of row cooling units comprise an upper section that supplies the supply liquid to a subset of the plurality of electronic racks.

* * * * *